United States Patent
Yu et al.

(10) Patent No.: US 11,733,302 B2
(45) Date of Patent: Aug. 22, 2023

(54) COMPLICATED SYSTEM FAULT DIAGNOSIS METHOD AND SYSTEM BASED ON MULTI-STAGE MODEL

(71) Applicant: Foshan University, Foshan (CN)

(72) Inventors: Wei Yu, Foshan (CN); Zhipeng Wang, Guangshui (CN); Chenglin Wen, Maoming (CN); Yan Jiang, Huanggang (CN); Rui Chen, Zhanjiang (CN); Henghui Liang, Zhaoqing (CN)

(73) Assignee: FOSHAN UNIVERSITY, Foshan (CN)

( * ) Notice: Subject to any disclaimer, the term of this patent is extended or adjusted under 35 U.S.C. 154(b) by 0 days.

(21) Appl. No.: 17/513,197

(22) Filed: Oct. 28, 2021

(65) Prior Publication Data
US 2022/0413050 A1 Dec. 29, 2022

(30) Foreign Application Priority Data
Jun. 23, 2021 (CN) .......................... 202110698367.5

(51) Int. Cl.
*G01R 31/34* (2020.01)
*H02P 21/18* (2016.01)
*H02P 29/024* (2016.01)

(52) U.S. Cl.
CPC ............ *G01R 31/343* (2013.01); *H02P 21/18* (2016.02); *H02P 29/024* (2013.01); *H02P 2207/055* (2013.01)

(58) Field of Classification Search
CPC .... G01R 31/343; G01R 31/34; G01R 31/346; H02P 21/18; H02P 29/024; H02P 2207/055; H02P 21/13
USPC .................................................. 324/765.01
See application file for complete search history.

(56) References Cited

U.S. PATENT DOCUMENTS

| | | | |
|---|---|---|---|
| 2014/0054103 A1* | 2/2014 | Kezobo | H02P 29/0243 180/446 |
| 2018/0278189 A1* | 9/2018 | Zhang | H02P 21/22 |
| 2019/0115859 A1* | 4/2019 | Ishino | H02P 6/185 |

OTHER PUBLICATIONS

Ma et al., "Current Sensor Fault Localization and Identification of PMSM Drives Using Difference Operator," in IEEE Journal of Emerging and Selected Topics in Power Electronics, 2022, doi: 10.1109/JESTPE.2022.3214534 (Year: 2022).*

* cited by examiner

*Primary Examiner* — Tung X Nguyen
*Assistant Examiner* — Robert P Alejnikov, Jr.
(74) *Attorney, Agent, or Firm* — WPAT, P.C

(57) ABSTRACT

Complicated system fault diagnosis method and system based on a multi-stage model are provided. The method includes: establishing an integer-order mathematical model, a 0.1-level fractional order mathematical model, and a 0.01-level fractional order mathematical model of a permanent magnet synchronous motor system; designing an integer-order status observer based on the integer-order mathematical model, designing a 0.1-level fractional order status observer based on the 0.1-level fractional order mathematical model, and designing a 0.01-level fractional order status observer based on the 0.01-level fractional mathematical model; corresponding residual values can be obtained by the observers and compared with corresponding threshold values to judge whether there is a fault. The system includes first through third modules. Observers with different accuracy degrees are set up and the permanent magnet synchronous motor system is diagnosed through the observers. The fault diagnosis method and system are mainly used in motor diagnosis.

3 Claims, 2 Drawing Sheets

```
┌─────────────────────────────────────────────────────────┐
│ Establish an integer-order mathematical model, a 0.1-level fractional mathematical │
│ model, a 0.01-level farctional mathematical model of the permanent magnet synchronous │
│                        motor system                     │
└─────────────────────────────────────────────────────────┘
                              │
                              ▼
┌─────────────────────────────────────────────────────────┐
│ Design the integer-order mathematical model into an integer-order state observer, the │
│ 0.1-level fractional mathematical model into 0.1-level fractional state observer, the 0.01- │
│    level fractional mathematical model into a 0.01-level fractional state observer │
└─────────────────────────────────────────────────────────┘
                              │
                              ▼
┌─────────────────────────────────────────────────────────┐
│      Collect the voltage and speed of the permanent magnet synchronous motor       │
└─────────────────────────────────────────────────────────┘
                              │
                              ▼
┌─────────────────────────────────────────────────────────┐
│ Take the voltage of the permanent magnet synchronous motor as the observer input and │
│                  the speed as the first comparison value │
└─────────────────────────────────────────────────────────┘
                              │
                              ▼
┌─────────────────────────────────────────────────────────┐
│  Input the observer input into the integer-order state observer to obtain the first │
│ rotational speed observation, perform difference processing between the first rotational │
│      speed observation and the first comparison value to obtain a first residual value │
└─────────────────────────────────────────────────────────┘
                              │
                              ▼
┌─────────────────────────────────────────────────────────┐
│  When the first residual value is greater than or equal to the first threshold, it is │
│  considered that there is a fault in the permanent magnet synchronous motor system, │
│                      otherwise, go to the next step     │
└─────────────────────────────────────────────────────────┘
                              │
                              ▼
┌─────────────────────────────────────────────────────────┐
│ Input the observer input into the 0.1-level fractional state observer to obtain the second │
│   rotational speed observation, perform difference processing between the second │
│   rotational speed observation and the second comparison value to obtain a second │
│                            residual value               │
└─────────────────────────────────────────────────────────┘
                              │
                              ▼
┌─────────────────────────────────────────────────────────┐
│ When the second residual value is greater than or equal to the second threshold, it is │
│  considered that there is a fault in the permanent magnet synchronous motor system, │
│                      otherwise, go to the next step     │
└─────────────────────────────────────────────────────────┘
                              │
                              ▼
┌─────────────────────────────────────────────────────────┐
│ Input the observer input into the 0.01-level fractional state observer to obtain the third │
│ rotational speed observation, perform difference processing between the third rotational │
│      speed observation and the first comparison value to obtain a third residual value │
└─────────────────────────────────────────────────────────┘
                              │
                              ▼
┌─────────────────────────────────────────────────────────┐
│ When the third residual value is greater than or equal to the third threshold, it is considered │
│ that there is a fault in the permanent magnet synchronous motor system, otherwise, it is │
│   considered that there is no fault in the permanent magnet synchronous motor system │
└─────────────────────────────────────────────────────────┘
```

FIG. 1

COMPLICATED SYSTEM FAULT DIAGNOSIS METHOD AND SYSTEM BASED ON MULTI-STAGE MODEL

TECHNICAL FIELD

The disclosure relates to the field of system fault diagnosis technologies, and more particularly to a complicated system fault diagnosis method and system based on the multi-stage model.

BACKGROUND

The fault diagnosis technology is developed as the need to establish a monitoring system emerges. The development of fault diagnosis technology has gone through three stages so far: in the first stage, the fault diagnosis relied on the expert's hands-on experience and simple instruments; the second stage was represented by the modern diagnostic technology, which employed sensor technology and dynamic testing technology as means and took signal analysis and modeling processing as basis; in recent years, as computer technology and intelligent information processing technology are evolved rapidly, the fault diagnosis technology has entered a new stage featured in data processing, wherein the model-based fault diagnosis method can be classified into the following three categories: 1) observer-based method; 2) equivalent space method; and 3) method based on parameter identification.

The observer-based fault diagnosis method is guided by modern control theory and modern optimization methods, and grounded on the mathematical model of the dynamic system. When a fault occurs, the corresponding observer is designed according to the change of the system status parameters, and the residuals are generated by using the observer and the actual system, and then the residuals are analyzed and evaluated based on certain criteria, so as to diagnose the fault of the system.

When the existing model-based fault diagnosis method performs fault diagnosis on systems with fractional order characteristics, for faults containing fractional orders (such as inter-turn short circuits and asymmetric faults), the fault diagnosis effect is not good, because the fractional order characteristics contained in complex systems are not taken into consideration.

SUMMARY

The objective of the invention is to provide a complex system fault diagnosis method based on the multi-stage model, in order to resolve one or more technical problems existing in the prior art, and at least to provide a beneficial choice or create conditions.

A solution to the technical problem according to the disclosure is to provide a complicated system fault diagnosis method based on a multi-stage model on one hand, which is applied for the fault diagnosis of permanent magnet synchronous motor system, including:

step 1, establishing an integer-order mathematical model of the permanent magnet synchronous motor system, establishing a 0.1-level fractional mathematical model of the permanent magnet synchronous motor system, and establishing a 0.01-level fractional mathematical model of the permanent magnet synchronous motor system;

step 2, designing an integer-order status observer based on the integer-order mathematical model, designing a 0.1-level fractional status observer based on the 0.1-level fractional order mathematical model, and designing a 0.01-level fractional order status observer based on the 0.01-level fractional order mathematical model;

step 3, collecting the voltage and the speed of the permanent magnet synchronous motor;

step 4, taking the voltage of the permanent magnet synchronous motor as the observer input, and taking the rotational speed as the first comparison value;

step 5, inputting the observer input into the integer-order status observer to obtain the first rotational speed observation (e.g., taking the voltage of the permanent magnet synchronous motor as the input into the integer-order status observer to get a first speed observation), and performing difference processing between the first rotational speed observation and the first comparison value to obtain a first residual value;

step 6, identifying a fault in the permanent magnet synchronous motor system when the first residual value is larger than or equal to the first threshold value,; otherwise moving to step 7;

step 7, inputting the observer input into the 0.1-level fractional order status observer to obtain the second rotational speed observation value (e.g., taking the voltage of the permanent magnet synchronous motor as the input into the 0.1-level fractional order status observer to get a second speed observation), and performing difference processing between the second rotational speed observation value and the first comparison value to obtain the second residual value;

step 8, identifying a fault in the permanent magnet synchronous motor system when the second residual value is larger than or equal to the second threshold value; otherwise going to step 9;

step 9, inputting the observer input into the 0.01-level fractional order status observer to obtain a third rotational speed observation value (e.g., taking the voltage of the permanent magnet synchronous motor as the input into the 0.01-level fractional order status observer to get a third speed observation value), and performing difference processing between the third rotational speed observation and the first comparison value to obtain a third residual value; and step 10, identifying a fault in the permanent magnet synchronous motor system when the third residual value is larger than or equal to the third threshold value; otherwise concluding that the permanent magnet synchronous motor system has no fault.

Further, the integer-order mathematical model of the permanent magnet synchronous motor system is as follows:

$$G_1(s) = \frac{1882000}{s^2 + 1278s + 278000}.$$

Further, the 0.1-level fractional order mathematical model of the permanent magnet synchronous motor system is as follows:

$$G_2(s) = \frac{a+b}{c+d};$$

wherein $a = 8.683e04s^{10} + 3.034e09s^9 + 2.063e13s^8 + 2.411e16s^7 + 6.281e18s^6$;
$b = 2.904e20s^5 + 3.006e21s^4 + 5.523e21s^3 + 2.262e21s^2 + 1.592e20s + 2.181e18$;

$c = 2.675e06s^{10} + 2.401e10s^9 + 1.817e13s^8 + 7.168e15s^7 + 1.088e18s^6;$ $d = 4.483e19s^5 + 4.435e20s^4 + 8.078e20s^3 + 3.297e20s^2 + 2.319e19s + 3.176e17.$

Further, the 0.01-level fractional order mathematical model of the permanent magnet synchronous motor system is as follows:

$$G_3(s) = \frac{e+f}{g+h};$$

wherein $e = 8.683e04s^{10} + 3.311e09s^9 + 2.494e13s^8 + 3.193e16s^7 + 9.213e18s^6;$ $f = 4.666e20s^5 + 5.351e21s^4 + 1.077e22s^3 + 4.886e21s^2 + 3.767e20s + 5.737e18;$ $g = 4.281e06s^{10} + 4.337e10s^9 + 3.347e13s^8 + 1.188e16s^7 + 1.693e18s^6;$ $h = 7.293e19s^5 + 7.905e20s^4 + 1.575e21s^3 + 7.12e20s^2 + 5.486e19s + 8.353e17.$ Further, the method of designing an integer-order status observer based on the integer-order mathematical model comprises the following:

setting the system status equation of the permanent magnet synchronous motor system as follows:

$$\begin{cases} \dot{x} = Ax + Bu \\ y = Cx \end{cases};$$

wherein u is an input, x is a status variable, and y is an output;

$$A = \begin{bmatrix} -1278 & -278000 \\ 1 & 0 \end{bmatrix}, B = \begin{bmatrix} 1 \\ 0 \end{bmatrix}, C = [0 \ 1882000],$$

selecting a pole s of the observer to be $[-10, -10]$, and using the formula $|sI - (A - LC)| = 0$, wherein I is an identity matrix, an observer feedback gain matrix being obtained as:

$$L = \begin{bmatrix} 0.5896 \\ -0.0005728 \end{bmatrix};$$

substituting the matrices A, B, C and L into the following formula:

$$\begin{cases} \dot{\hat{x}} = A\hat{x} + Bu + L(y - \hat{y}) \\ \hat{y} = C\hat{x} \end{cases};$$

then the status space equation of the integer order status observer is obtained

Further, the method of designing a 0.1-level fractional status observer based on the 0.1-level fractional mathematical model comprises: setting a structure of a system status equation of the permanent magnet synchronous motor system as follows:

$$\begin{cases} \dot{x} = Ax + Bu \\ y = Cx \end{cases};$$

wherein u is an input, x is a status variable, and y is an output;

$$A = \begin{bmatrix} -8975 & -679e6 & -267e09 & -4.07e11 & -1.67e13 & -1.65e14 & -3.02e14 & 1.23e14 & -8.67e12 & -1.2e11 \\ 1 & 0 & 0 & 0 & 0 & 0 & 0 & 0 & 0 & 0 \\ 0 & 1 & 0 & 0 & 0 & 0 & 0 & 0 & 0 & 0 \\ 0 & 0 & 1 & 0 & 0 & 0 & 0 & 0 & 0 & 0 \\ 0 & 0 & 0 & 1 & 0 & 0 & 0 & 0 & 0 & 0 \\ 0 & 0 & 0 & 0 & 1 & 0 & 0 & 0 & 0 & 0 \\ 0 & 0 & 0 & 0 & 0 & 1 & 0 & 0 & 0 & 0 \\ 0 & 0 & 0 & 0 & 0 & 0 & 1 & 0 & 0 & 0 \\ 0 & 0 & 0 & 0 & 0 & 0 & 0 & 1 & 0 & 0 \\ 0 & 0 & 0 & 0 & 0 & 0 & 0 & 0 & 1 & 0 \end{bmatrix},$$

$$B = \begin{bmatrix} 1 \\ 0 \\ 0 \\ 0 \\ 0 \\ 0 \\ 0 \\ 0 \\ 0 \\ 0 \end{bmatrix},$$

$$C = [8.42e2 \ \ 7.49e6 \ \ 8.92e9 \ \ 2.33e12 \ \ 1.08e14 \ \ 1.18e15 \ \ 2.05e15 \ \ 8.41e14 \ \ 5.92e13 \ \ 8.11e11];$$

selecting a pole s of the observer as [−10, −10, −10, −10, −10, −10, −10, −10, −10, −10], and using the formula |sI−(A−LC)|=0, wherein I is the identity matrix, and an observer feedback gain matrix being obtained as follows:

$$L = \begin{bmatrix} -139.0 \\ 0.006091 \\ -7.032e-7 \\ 1.837e-10 \\ -6.806e-15 \\ 1.506e-18 \\ -6.414e-22 \\ 2.409e-22 \\ -2.079e-21 \\ -5.354e-20 \end{bmatrix};$$

substituting the matrices A, B, C and L into the following formula:

$$\begin{cases} \dot{\hat{x}} = A\hat{x} + Bu + L(y - \hat{y}) \\ \hat{y} = C\hat{x} \end{cases};$$

then the status equation of 0.1 order fractional order status observer is obtained.

Further, the method of designing a 0.01-level fractional order status observer based on a 0.01-level fractional order mathematical model comprises the following: setting a structure of a system status equation of the permanent magnet synchronous motor system as follows:

$$\begin{cases} \dot{x} = Ax + Bu \\ y = Cx \end{cases};$$

wherein u is an input, x is a status variable, and y is an output;

$$A = \begin{bmatrix} -1.01e4 & -7.82e6 & -2.78e09 & -3.95e11 & -1.70e13 & -1.85e14 & -3.68e14 & 1.66e14 & -1.28e13 & -1.95e11 \\ 1 & 0 & 0 & 0 & 0 & 0 & 0 & 0 & 0 & 0 \\ 0 & 1 & 0 & 0 & 0 & 0 & 0 & 0 & 0 & 0 \\ 0 & 0 & 1 & 0 & 0 & 0 & 0 & 0 & 0 & 0 \\ 0 & 0 & 0 & 1 & 0 & 0 & 0 & 0 & 0 & 0 \\ 0 & 0 & 0 & 0 & 1 & 0 & 0 & 0 & 0 & 0 \\ 0 & 0 & 0 & 0 & 0 & 1 & 0 & 0 & 0 & 0 \\ 0 & 0 & 0 & 0 & 0 & 0 & 1 & 0 & 0 & 0 \\ 0 & 0 & 0 & 0 & 0 & 0 & 0 & 1 & 0 & 0 \\ 0 & 0 & 0 & 0 & 0 & 0 & 0 & 0 & 1 & 0 \end{bmatrix},$$

$$B = \begin{bmatrix} 1 \\ 0 \\ 0 \\ 0 \\ 0 \\ 0 \\ 0 \\ 0 \\ 0 \\ 0 \end{bmatrix},$$

$$C = \begin{bmatrix} 5.67e2 & 5.67e6 & 7.40e9 & 2.14e12 & 1.08e14 & 1.24e15 & 2.51e15 & 1.14e15 & 8.77e13 & 1.34e12 \end{bmatrix};$$

selecting a pole s of the observer as [−10, −10, −10, −10, −10, −10, −10, −10, −10, −10], and using the formula |sI−(A−LC)|=0, wherein I is an identity matrix, and an observer feedback gain matrix being obtained as follows:

$$L = \begin{bmatrix} -53.03 \\ 0.03084 \\ -3.12e-6 \\ 3.97e-10 \\ -1.728e-14 \\ 3.065e-18 \\ -8.111e-22 \\ 9.273e-24 \\ 1.632e-21 \\ -1.023e-19 \end{bmatrix};$$

substituting the matrices A, B, C and L into the following formula:

$$\begin{cases} \dot{\hat{x}} = A\hat{x} + Bu + L(y - \hat{y}) \\ \hat{y} = C\hat{x} \end{cases};$$

then the status equation of the 0.01-level fractional order status observer is obtained.

In this embodiment, the first threshold value $\xi_1$, the second threshold value $\xi_2$ and the third threshold value $\xi_3$ are set. According to a precise motion control application scenario, the first threshold value output by the complex system is set to $\xi_1=2$; the second threshold value is set to $\xi_2=0.5$, and the third threshold value is set to $\xi_3=0.2$.

On the other hand, another solution to the technical problem of the disclosure is to provide a complex system fault diagnosis system based on the multi-stage model, including:

a first module, used for the following aspects: storing the integer-order mathematical model of the permanent magnet synchronous motor system, and storing the 0.1-level fractional-order mathematical model of the permanent magnet synchronous motor system, and storing the 0.01-level fractional-order mathematical model of the permanent magnet synchronous motor system; designing the integer-order status observer based on the integer-order mathematical model, designing 0.1-order fractional-order status observer based on the 0.1-level fractional-order mathematical model, and designing the 0.01-order fractional-order status observer based on the 0.01-level fractional-order mathematical model;

a second module used to collect a voltage and a rotational speed of the permanent magnet synchronous motor;

a third module used to take the voltage of the permanent magnet synchronous motor as an observer input and take the speed as a first comparison value; input the observer input into the integer-order status observer to obtain a first rotational speed observation (e.g., take the voltage of the permanent magnet synchronous motor as the input into the integer-order status observer to get a first speed observation), and perform difference processing between the first rotational speed observation and the first comparison value to obtain a first residual value; identify a fault in the permanent magnet synchronous motor system when the first residual value is larger than or equal to a first threshold value; otherwise, input the observer input into the 0.1-level fractional order status observer to obtain a second rotational speed observation (e.g., take the voltage of the permanent magnet synchronous motor as the input into the 0.1-level fractional order status observer to get a second speed observation), and perform difference processing between the second rotational speed observation and the first comparison value to obtain a second residual value; identify a fault in the permanent magnet synchronous motor system when the second residual value is larger than or equal to the second threshold value; otherwise, input the observer input into the 0.01-level fractional order status observer to obtain a third rotational speed observation (e.g., take the voltage of the permanent magnet synchronous motor as the input into the 0.01-level fractional order status observer to get a third speed observation), perform difference processing between the third rotational speed observation and the first comparison value to obtain a third residual value; identify a fault in the permanent magnet synchronous motor system when the third residual value is larger than or equal to a third threshold; otherwise conclude that there is no fault in the permanent magnet synchronous motor system.

The diagnosis method of the disclosure uses observers with different degrees of accuracy to perform fault diagnosis on the permanent magnet synchronous motor system, so that the whole diagnosis is accurate and precise, and meanwhile a diagnosis system for executing the diagnosis method is provided.

BRIEF DESCRIPTION OF THE DRAWINGS

In order to describe the technical solutions in the embodiments of the disclosure more clearly, the following will briefly describe the drawings that will be used in the description of the embodiments.

FIG. 1 is the flow diagram of a fault diagnosis method based on the complex system with the multi-stage model;

DETAILED DESCRIPTION OF EMBODIMENTS

Figure 2:
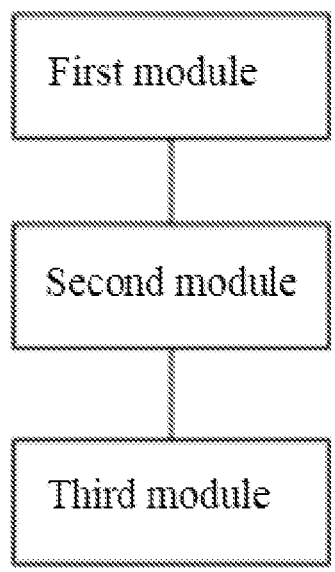
FIG. 2 is the system block diagram of the fault diagnosis system based on the complex system with the multi-stage model.

In the following content, the concept, specific structure and technical effects of the disclosure will be clearly and completely described in conjunction with the embodiments and drawings, so as to fully understand the objective, features and effects of the disclosure. Apparently, the described embodiments are only a part of the embodiments of the disclosure, rather than all the embodiments. Based on the embodiments of the disclosure, other embodiments obtained by those skilled in the art without creative work shall fall within the protection scope of the disclosure. In addition, all the connecting/linking relations mentioned in the disclosure do not only refer to the direct connection of the components, but refer to the fact that a better connection structure can be formed by adding or reducing the connection accessories according to the specific embodiment. The technical features in the disclosure can be combined interactively under the premise of not conflicting with each other.

Embodiment 1, referring to FIG. 1, a fault diagnosis method based on a complex system with a multi-stage model, applied for fault diagnosis of a permanent magnet synchronous motor system, comprises the following steps:

step 1, establishing an integer-order mathematical model of the permanent magnet synchronous motor system, establishing a 0.1-level fractional order mathematical model of the permanent magnet synchronous motor system, and establishing a 0.01-level fractional order mathematical model of the permanent magnet synchronous motor system;

step 2, designing an integer-order status observer based on the integer-order mathematical model, designing a 0.1-level fractional order status observer based on the 0.1-level fractional mathematical model, and designing a 0.01-level fractional order status observer based on a 0.01-level fractional order mathematical model;

step 3, collecting the voltage and the speed of the permanent magnet synchronous motor;

step 4, taking the voltage of the permanent magnet synchronous motor as the observer input and taking the speed as the first comparison value;

step 5, inputting the observer input into the integer-order status observer to obtain a first rotational speed observation (e.g., taking the voltage of the permanent magnet synchronous motor as the input into the integer-order status observer to get the first speed observation), performing difference processing between the first rotational speed observation and the first comparison value to obtain the first residual value;

step 6, identifying a fault in the permanent magnet synchronous motor system when the first residual value is larger than or equal to the first threshold value; otherwise, moving to step 7;

step 7, inputting the observer input into the 0.1-level fractional order status observer to obtain the second rotational speed observation (e.g., taking the voltage of the permanent magnet synchronous motor as the input into the 0.1-level fractional status observer to get the second speed observation), and performing difference processing between the second rotational speed observation and the first comparison value to obtain a second residual value;

step 8, identifying a fault in the permanent magnet synchronous motor system when the second residual value is larger than or equal to a second threshold value; otherwise, going to step 9;

step 9, inputting the observer input into the 0.01-level fractional order status observer to obtain a third rotational speed observation (e.g., taking the voltage of the permanent magnet synchronous motor as the input into the 0.01-level fractional order status observer to get a third speed observation), and performing difference processing between the third rotational speed observation and the first comparison value to obtain a third residual value; and step 10, identifying a fault in the permanent magnet synchronous motor system when the third residual value is larger than or equal to a third threshold value; otherwise, concluding no fault in the permanent magnet synchronous motor system.

The disclosure is mainly applied for the fault diagnosis of the permanent magnet synchronous motor system, which has a fractional order phenomenon for the permanent magnet synchronous motor system. Moreover, considering the accuracy of the fault, the disclosure sets up a three-layer fault diagnosis scheme, that is, the fault is diagnosed through the integer-order status observer, the 0.1-level fractional order status observer and the 0.01-level fractional order status observer in sequence, so as to diagnose faults caused by minor influences accurately.

In step 2, the method of designing an integer-order status observer based on the integer-order mathematical model comprises the following: the integer-order mathematical model is transformed into a status space, and then according to the status space, the feedback gain is selected to design an integer-order status observer. A method of designing a 0.1-level fractional order status observer based on the 0.1-level fractional mathematical model comprises the following steps: transforming the 0.1 fractional mathematical model into a status space, and then according to the status space, selecting the feedback gain to design a 0.1 fractional order status observer. A method of designing a 0.01-level fractional order status observer based on a 0.01-level fractional order mathematical model comprises the following steps: transforming the 0.01 fractional order mathematical model into the status space, and then according to the status space, selecting the feedback gain to design the 0.01 fractional order status observer.

Wherein the 0.1-level fractional order mathematical model is approximated from the integer-order mathematical model through the Oustaloup recursive filter method. The 0.01-level fractional order mathematical model is approximated from the 0.01-level fractional order mathematical model through the Oustaloup recursive filter method.

Those of ordinary skill in the art may understand that all or some of the steps and systems in the methods disclosed above can be implemented as software, firmware, hardware, and appropriate combinations thereof. Some physical components or all physical components may be implemented as software executed by a processor, such as a central processing unit, a digital signal processor, or a microprocessor, either implemented as hardware, or implemented as an integrated circuit, such as a specific integrated circuit. Such software may be distributed on computer-readable medium, and the computer-readable media comprises computer storage media (or non-temporary media) and communication media (or temporary media). As known to those of ordinary skill in the art, the computer storage media comprises random access and nonrandom access, removable and non-removable media implemented in any method or technology for storing information (Such as computer readable instructions, data structures, program modules or other data). Computer storage media include but are not limited to RAM, ROM, EEPROM, flash memory or other memory technologies, CD-ROM, digital versatile disk (DVD) or other optical disk storage, magnetic cassettes, magnetic tapes, magnetic disk storage or other magnetic storage devices, or any other media that can be used to store desired information and that can be accessed by a computer. In addition, it is well known to those of ordinary skill in the art that the communication media usually contain computer readable instructions, data structures, program modules, or other data in a modulated data signal such as carrier wave or other transmission mechanism, and may comprise any information transmission media.

For the integer-order mathematical model, 0.1-level fractional order mathematical model, and 0.01-level fractional order mathematical model of the disclosure, the IDE parameter identification method (Improved differential evolution algorithm) can be used to measure the status parameters of the permanent magnet synchronous motor at work for multiple times, such as current and voltage, and the nameplate parameters of the motor. The identification parameters of the IDE parameter identification method is adjusted to obtain integer-order mathematical models, 0.1-level fractional order mathematical models, and 0.01-level fractional order mathematical models. This disclosure uses the improved differential evolution algorithm (IDE parameter identification method) described in the China patent application No. CN111786601A.

In some embodiments, the integer-order mathematical model of the permanent magnet synchronous motor system is as follows:

$$G_1(s) = \frac{1882000}{s^2 + 1278s + 278000}.$$

In some embodiments, the 0.1-level fractional order mathematical model of the permanent magnet synchronous motor system is as follows:

$$G_2(s) = \frac{a+b}{c+d}.$$

wherein a=$8.683e04s^{10}$+$3.034e09s^9$+$2.063e13s^8$+$2.411e16s^7$+$6.281e18s^6$;
b=$2.904e20s^5$+$3.006e21s^4$+$5.523e21s^3$+$2.262e21s^2$+$1.592e20s$ +2.181e18;
c=$2.675e06s^{10}$+$2.401e10s^9$+$1.817e13s^8$+$7.168e15s^7$+$1.088e18s^6$;
d=$4.483e19s^5$+$4.435e20s^4$+$8.078e20s^3$+$3.297e20s^2$+$2.319e19s$ +3.176e17.

In some embodiments, the 0.01-level fractional order mathematical model of the permanent magnet synchronous motor system is as follows:

$$G_3(s) = \frac{e+f}{g+h};$$

wherein e=$8.683e04s^{10}$+$3.311e09s^9$+$2.494e13s^8$+$3.193e16s^7$+$9.213e18s^6$;
f=$4.666e20s^5$+$5.351e21s^4$+$1.077e22s^3$+$4.886e21s^2$+$3.767e20s$ +5.737e18;
g=$4.281e06s^{10}$+$4.337e10s^9$+$3.347e13s^8$+$1.188e16s^7$+$1.693e18s^6$;
h=$7.293e19s^5$+$7.905e20s^4$+$1.575e21s^3$+$7.12e20s^2$+$5.486e19s$+8.353e17.

After obtaining the integer-order mathematical model, the 0.1-level fractional order mathematical model and the 0.01-level fractional order mathematical model of the permanent magnet synchronous motor system, then the corresponding observers can be designed for the integer-order mathematical model, the 0.1-level fractional order mathematical model and the 0.01-level fractional order mathematical model of the permanent magnet synchronous motor system.

And the method of designing an integer-order status observer based on the integer-order mathematical model comprises: setting the system status equation of the permanent magnet synchronous motor system as follows:

$$\begin{cases} \dot{x} = Ax + Bu \\ y = Cx \end{cases};$$

wherein u is an input, x is a status variable, and y is an output;

$$A = \begin{bmatrix} -1278 & -278000 \\ 1 & 0 \end{bmatrix}, B = \begin{bmatrix} 1 \\ 0 \end{bmatrix}, C = \begin{bmatrix} 0 & 1882000 \end{bmatrix};$$

selecting a pole s of the observer to be [−10, −10], and applying the formula |sI−(A−LC)|=0, wherein I is the identity matrix, and an observer feedback gain matrix is obtained as:

$$L = \begin{bmatrix} 0.5896 \\ -0.0005728 \end{bmatrix};$$

substituting the matrices A, B, C and L into the following formula:

$$\begin{cases} \dot{\hat{x}} = A\hat{x} + Bu + L(y - \hat{y}) \\ \hat{y} = C\hat{x} \end{cases};$$

and then obtaining the status space equation of the integer order status observer.

The method of designing a 0.1-level fractional status observer based on the 0.1-level fractional order mathematical model comprises the following steps: setting the system status equation of the permanent magnet synchronous motor system as follows:

$$\begin{cases} \dot{x} = Ax + Bu \\ y = Cx \end{cases};$$

wherein u is an input, x is a status variable, and y is an output;

$$A = \begin{bmatrix} -8975 & -679e6 & -267e09 & -4.07e11 & -1.67e13 & -1.65e14 & -3.02e14 & 1.23e14 & -8.67e12 & -1.2e11 \\ 1 & 0 & 0 & 0 & 0 & 0 & 0 & 0 & 0 & 0 \\ 0 & 1 & 0 & 0 & 0 & 0 & 0 & 0 & 0 & 0 \\ 0 & 0 & 1 & 0 & 0 & 0 & 0 & 0 & 0 & 0 \\ 0 & 0 & 0 & 1 & 0 & 0 & 0 & 0 & 0 & 0 \\ 0 & 0 & 0 & 0 & 1 & 0 & 0 & 0 & 0 & 0 \\ 0 & 0 & 0 & 0 & 0 & 1 & 0 & 0 & 0 & 0 \\ 0 & 0 & 0 & 0 & 0 & 0 & 1 & 0 & 0 & 0 \\ 0 & 0 & 0 & 0 & 0 & 0 & 0 & 1 & 0 & 0 \\ 0 & 0 & 0 & 0 & 0 & 0 & 0 & 0 & 1 & 0 \end{bmatrix},$$

$$B = \begin{bmatrix} 1 \\ 0 \\ 0 \\ 0 \\ 0 \\ 0 \\ 0 \\ 0 \\ 0 \\ 0 \end{bmatrix}, C = \begin{bmatrix} 8.42e2 & 7.49e6 & 8.92e9 & 2.33e12 & 1.08e14 & 1.18e15 & 2.05e15 & 8.41e14 & 5.92e13 & 8.11e11 \end{bmatrix};$$

selecting a pole s of the observer as [−10, −10, −10, −10, −10, −10, −10, −10, −10, −10], and applying the formula |sI−(A−LC)|=0, wherein I is an identity matrix, and an observer feedback gain matrix is obtained as:

$$L = \begin{bmatrix} -139.0 \\ 0.006091 \\ -7.032e-7 \\ 1.837e-10 \\ -6.806e-15 \\ 1.506e-18 \\ -6.414e-22 \\ 2.409e-22 \\ -2.079e-21 \\ -5.354e-20 \end{bmatrix};$$

substituting the matrices A, B, C and L into the following formula:

$$\begin{cases} \dot{\hat{x}} = A\hat{x} + Bu + L(y - \hat{y}) \\ \hat{y} = C\hat{x} \end{cases};$$

And then obtaining a status equation of the 0.1-level fractional status observer.

A method of designing a 0.01-level fractional order status observer based on a 0.01-level fractional mathematical order model comprises the following steps: setting the system status equation of the permanent magnet synchronous motor system as follows:

$$\begin{cases} \dot{x} = Ax + Bu \\ y = Cx \end{cases};$$

wherein u is an input, x is a status variable, and y is an output;

$$A = \begin{bmatrix} -1.01e4 & -7.82e6 & -2.78e09 & -3.95e11 & -1.70e13 & -1.85e14 & -3.68e14 & 1.66e14 & -1.28e13 & -1.95e11 \\ 1 & 0 & 0 & 0 & 0 & 0 & 0 & 0 & 0 & 0 \\ 0 & 1 & 0 & 0 & 0 & 0 & 0 & 0 & 0 & 0 \\ 0 & 0 & 1 & 0 & 0 & 0 & 0 & 0 & 0 & 0 \\ 0 & 0 & 0 & 1 & 0 & 0 & 0 & 0 & 0 & 0 \\ 0 & 0 & 0 & 0 & 1 & 0 & 0 & 0 & 0 & 0 \\ 0 & 0 & 0 & 0 & 0 & 1 & 0 & 0 & 0 & 0 \\ 0 & 0 & 0 & 0 & 0 & 0 & 1 & 0 & 0 & 0 \\ 0 & 0 & 0 & 0 & 0 & 0 & 0 & 1 & 0 & 0 \\ 0 & 0 & 0 & 0 & 0 & 0 & 0 & 0 & 1 & 0 \end{bmatrix},$$

$$B = \begin{bmatrix} 1 \\ 0 \\ 0 \\ 0 \\ 0 \\ 0 \\ 0 \\ 0 \\ 0 \\ 0 \end{bmatrix}, C = [\,5.67e2 \quad 5.67e6 \quad 7.40e9 \quad 2.14e12 \quad 1.08e14 \quad 1.24e15 \quad 2.51e15 \quad 1.14e15 \quad 8.77e13 \quad 1.34e12\,];$$

selecting a pole s of the observer as $[-10, -10, -10, -10, -10, -10, -10, -10, -10, -10]$, and applying the formula $|sI-(A-LC)|=0$, wherein I is an identity matrix, and an observer feedback gain matrix is obtained as:

$$L = \begin{bmatrix} -53.03 \\ 0.03084 \\ -3.12e-6 \\ 3.97e-10 \\ -1.728e-14 \\ 3.065e-18 \\ -8.111e-22 \\ 9.273e-24 \\ 1.632e-21 \\ -1.023e-19 \end{bmatrix};$$

substituting the matrices A, B, C and L into the following formula:

$$\begin{cases} \dot{\hat{x}} = A\hat{x} + Bu + L(y - \hat{y}) \\ \hat{y} = C\hat{x} \end{cases};$$

And then obtaining the status equation of the 0.01-order fractional status observer.

The first threshold value $\xi_1$, the second threshold value $\xi_2$ and the third threshold value $\xi_3$ are set. According to the precise motion control application scenario, the first threshold value of the output of the complex system is set to $\xi_1=2$; the second threshold value is set to $\xi_2=0.5$, and the third threshold value is set to $\xi_3=0.2$.

After obtaining the status space equation of the integer-order status observer, the status equation of the 0.1-order fractional status observer, the status equation of the 0.01-order fractional status observer and the first threshold value, the second threshold value, and third threshold value required for fault detection, then the actual permanent magnet synchronous motor system can be diagnosed by the observation obtained by the observer.

Specifically, the voltage and speed of the permanent magnet synchronous motor system can be collected, the voltage is used as the observer input, and the speed can be used as the first comparison value;

first, inputting the observer input into the integer-order status observer to obtain the first rotational speed observation (e.g., taking the voltage of the permanent magnet synchronous motor as the input into the integer-order status observer to get a first speed observation), and performing difference processing between the first rotational speed observation and the first comparison value to obtain the first residual value.

Considering the cost of judgment, the observer input is input to the integer-order status observer with lower accuracy, and the first rotational speed observation is obtained through the integer-order status observer. The first residual value is obtained by performing difference processing between the first rotational speed observation and the first comparison value. The first residual value is compared with the first threshold value; when the first residual value is larger than or equal to the first threshold value, a fault is identified in the permanent magnet synchronous motor system.

Certainly, if the first residual value is smaller than the first threshold value, it cannot be directly concluded that there is no fault in the permanent magnet synchronous motor system. Due to the low precision of the integer-order status observer, the fault conditions that can be reflected by the first residual value are limited, so further judgment is needed.

When the integer-order status observer cannot determine whether the permanent magnet synchronous motor system has faults, the 0.1-order fractional order status observer can be used for observation and judgment.

Inputting the observer input into the 0.1-level fractional order status observer to obtain the second rotational speed observation (e.g., taking the voltage of the permanent magnet synchronous motor as the input into the 0.1-level fractional status observer to get a second speed observation), and performing difference processing between the second rotational speed observation and the first comparison value to obtain a second residual value.

The second residual value is obtained by performing difference processing between the second rotational speed observation and the first comparison value. The second residual value is compared with the second threshold value, and when the second residual value is larger than or equal to the second threshold value, it is judged that the permanent magnet synchronous motor system has a fault.

Certainly, if the second residual value is smaller than the second threshold value, it cannot be directly concluded that there is no fault in the permanent magnet synchronous motor system. Since the accuracy of the 0.1-level fractional status observer is low, the fault information that can be reflected by the second residual value is limited, so further judgment is needed.

In the case that the 0.1-level fractional order status observer cannot determine whether the permanent magnet synchronous motor system has faults, the 0.01-level fractional status observer can be considered for observation and judgment.

Inputting the observer input into the 0.01-level fractional status observer to obtain the third rotational speed observation (e.g., taking the voltage of the permanent magnet synchronous motor as the input into the 0.01-level fractional status observer to get a third speed observation), and performing difference processing between the third rotational speed observation and the first comparison value to obtain a third residual value.

The third residual value is obtained by performing difference processing between the third rotational speed observation and the first comparison value. The third residual value is compared with the third threshold value; when the third residual value is larger than or equal to the third threshold value, it is judged that the permanent magnet synchronous motor system has a fault. Otherwise, it is concluded that there is no fault in the permanent magnet synchronous motor system.

With reference to FIG. 2, on the other hand, the disclosure provides a fault diagnosis system based on a complex system with a multi-stage model, including:

a first module used for storing an integer-order mathematical model, a 0.1-level fractional order mathematical model and a 0.01-level fractional order mathematical model of permanent magnet synchronous motor system; designing an integer-order status observer based on the integer-order mathematical model, designing a 0.1-level fractional order status observer based on the 0.1-level fractional mathematical model, and designing a 0.01-level fractional order status observer based on the 0.01-level fractional mathematical model;

a second module used for collecting a voltage and a speed of the permanent magnet synchronous motor.

a third module used for taking the voltage of the permanent magnet synchronous motor as the observer input and taking the speed as the first comparison value; inputting the observer input into the integer-order status observer to get a first rotational speed observation (e.g., taking the voltage of the permanent magnet synchronous motor as the input into the integer-order status observer to get a first speed observation), and performing difference processing between the first rotational speed observation and the first comparison value to obtain a first residual value; identifying a fault in the permanent magnet synchronous motor system when the first residual value is larger than or equal to a first threshold; otherwise, inputting the observer input into the 0.1-level fractional order status observer to obtain a second rotational speed observation (e.g., taking the voltage of the permanent magnet synchronous motor as the input into the 0.1-level fractional order status observer to get a second speed observation), performing difference processing between the second rotational speed observation and the first comparison value to obtain a second residual value; identifying a fault in the permanent magnet synchronous motor system when the second residual value is larger than or equal to a second threshold value; otherwise, inputting the observer input into the 0.01-level fractional status observer to obtain a third rotational speed observation (e.g., taking the voltage of the permanent magnet synchronous motor as the input into the 0.01-level fractional order status observer to get a third speed observation), performing difference processing between the third rotational speed observation and the first comparison value to obtain a third residual value; identifying a fault in the permanent magnet synchronous motor system when the third residual value is larger than or equal to a third threshold; otherwise it is concluded that there is no fault in the permanent magnet synchronous motor system.

The preferred embodiments of the disclosure are described in detail above, but the disclosure is not limited to the described embodiments. Those skilled in the art can make various equivalent modifications or substitutions without departing from the spirit of the disclosure, and these equivalent modifications or substitutions are all included in the scope defined by the claims of this application.

What is claimed is:

1. A complicated system fault diagnosis method based on a multi-stage model, applied for fault diagnosis of a permanent magnet synchronous motor system, comprising:

step 1, establishing an integer-order mathematical model of the permanent magnet synchronous motor system, establishing a 0.1-level fractional order mathematical model of the permanent magnet synchronous motor system, and establishing a 0.01-level fractional order mathematical model of the permanent magnet synchronous motor system;

step 2, designing an integer-order status observer based on the integer-order mathematical model, designing a 0.1-level fractional order status observer based on the 0.1-level fractional mathematical model, and designing a 0.01-level fractional order status observer based on the 0.01-level fractional mathematical model;

step 3, collecting the voltage and the speed of the permanent magnet synchronous motor;

step 4, taking the voltage of the permanent magnet synchronous motor as an observer input and taking the speed as a first comparison value;

step 5, inputting the observer input into the integer-order status observer to obtain the first rotational speed observation, and performing difference processing between the first rotational speed observation and the first comparison value to obtain a first residual value;

step 6, identifying a fault in the permanent magnet synchronous motor system when the first residual value is larger than or equal to the first threshold value; otherwise moving to step 7;

step 7, inputting the observer input into the 0.1-level fractional status observer to obtain a second rotational speed observation, and performing difference processing between the second rotational speed observation and the first comparison value to obtain a second residual value;

step 8, identifying a fault in the permanent magnet synchronous motor system when the second residual value is larger than or equal to the second threshold value; otherwise moving to step 9;

step 9, inputting the observer input into the 0.01-level fractional order status observer to obtain a third rotational speed observation, and performing difference processing between the third rotational speed observation and the first comparison value to obtain the third residual value; and step 10, identifying a fault in the permanent magnet synchronous motor system when the third residual value is larger than or equal to a third threshold value; otherwise concluding that the permanent magnet synchronous motor system has no fault.

2. The complicated system fault diagnosis method based on a multi-stage model according to claim 1, wherein the first threshold value $\xi_1$, the second threshold value $\xi_2$ and the third threshold value $\xi_3$ are set according to a precise motion control application scenario; the first threshold value is set to $\xi_1=2$, the second threshold value is set to $\xi_2=0.5$, and the third threshold value is set to $\xi_3=0.2$.

3. A complicated system fault diagnosis system based on a multi-stage model, comprising:

a first module, storing an integer-order mathematical model of a permanent magnet synchronous motor system, a 0.1-level fractional order mathematical model of the permanent magnet synchronous motor system and a 0.01-level fractional order mathematical model of the permanent magnet synchronous motor system, designing an integer-order status observer based on the integer-order mathematical model, designing a 0.1-level fractional order status observer based on the 0.1-level fractional mathematical model, and designing a 0.01-level fractional order status observer based on the 0.01-level fractional order mathematical model;

a second module, collecting a voltage and a speed of the permanent magnet synchronous motor;

a third module, taking the voltage of the permanent magnet synchronous motor as an observer input and taking the speed as a first comparison value; used for inputting the observer input into the integer-order status observer to obtain a first rotational speed observation, and performing difference processing between the first rotational speed observation and the first comparison value to obtain a first residual value; used for identifying a fault in the permanent magnet synchronous motor system when the first residual value is larger than or equal to a first threshold value; otherwise, used for inputting the observer input into the 0.1-level fractional order status observer to obtain a second rotational speed observation, and performing difference processing between the second rotational speed observation and the first comparison value to obtain a second residual value; used for identifying a fault in the permanent magnet synchronous motor system when the second residual value is larger than or equal to a second threshold value; otherwise, used for inputting the observer input into the 0.01 grade fractional status observer to obtain a third rotational speed observation, and perform difference processing between the third rotational speed observation and the first comparison value to obtain a third residual value; used to identify a fault in the permanent magnet synchronous motor system when the third residual value is greater than or equal to a third threshold; otherwise used to conclude no fault in the permanent magnet synchronous motor system;

wherein the first module, the second module and the third module are software modules stored in a memory and executable by a processor coupled to the memory.

* * * * *